United States Patent
Hollstein

[11] Patent Number: 6,113,752
[45] Date of Patent: Sep. 5, 2000

[54] METHOD AND DEVICE FOR COATING SUBSTRATE

[75] Inventor: Frank Hollstein, Hirschfelde, Germany

[73] Assignee: Techno-Coat Oberflachentechnik GmbH, Zittau, Germany

[21] Appl. No.: 09/348,914

[22] Filed: Jul. 7, 1999

[30] Foreign Application Priority Data

Jul. 7, 1998 [DE] Germany .................. 198 30 223

[51] Int. Cl.⁷ .......................... C23C 14/34; C23C 14/36
[52] U.S. Cl. ........................ 204/192.12; 204/192.11; 204/192.1; 204/192.2; 204/192.22; 204/192.15; 204/298.12; 204/298.09; 204/298.23; 204/298.27; 204/298.28; 204/192.16
[58] Field of Search .................. 204/192.11, 192.12, 204/192.1, 298.12, 298.09, 298.23, 298.27, 298.28, 192.2, 192.22, 192.15, 192.16

[56] References Cited

U.S. PATENT DOCUMENTS

| | | |
|---|---|---|
| 4,166,018 | 8/1979 | Chapin . |
| 4,356,073 | 10/1982 | McKelvey . |
| 4,443,318 | 4/1984 | McKelvey . |
| 4,793,908 | 12/1988 | Scott et al. .......................... 204/192.26 |

FOREIGN PATENT DOCUMENTS

| | | |
|---|---|---|
| 495215 | 7/1992 | European Pat. Off. . |
| 2253879 | 5/1974 | Germany . |
| 1194428 | 6/1970 | United Kingdom . |

*Primary Examiner*—Alan Diamond
*Attorney, Agent, or Firm*—Baker Botts L.L.P.

[57] ABSTRACT

A device and a process for multilayer PVD ("Physical Vapor Deposition") coating of substances includes one or more sputter target systems. A sputter target system generally consists of a plurality of individual targets arranged in the cross-sectional shape of a hollow regular polygon. The arrangement is rotatably mounted about the axis of symmetry of the hollow polygon. In the interior of the hollow polygon, preferably magnetrons (inner magnetrons) are present. By virtue of shielding, only one individual target of the sputter target system is exposed to the ionic bombardment at any one time. The multilayer coating is accomplished according to the invention by a coating strategy with step wise rotation, controlled according to plan, of the sputter target system in angular steps corresponding to the order of symmetry of the hollow polygon. Besides magnetron sputter, the invention is applicable also to other PVD coating processes, preferably to coating by means of electric arc, low-voltage electron beam and/or laser-supported evaporation or a combination of such processes.

18 Claims, 3 Drawing Sheets

METHOD AND DEVICE FOR COATING SUBSTRATE

FIELD OF THE INVENTION

The invention relates to a device and a process for multilayer PVD ("physical vapor deposition") coating of substrates, preferably using a magnetron sputter system.

BACKGROUND

The term "magnetron sputter" denotes an industrially well established technology for PVD coating of objects (substrates) by sputtering of solids ("targets"). This sputtering of the target is accomplished by bombardment with high-energy ions, usually ions of the rare gas argon (sputter gas). The ionic bombardment is initiated by gas discharge processes. The ions of the sputter gas are subjected to controlled acceleration in the direction of the target at such high kinetic energies that individual atoms and even crystallites are knocked out of the target. The process may be carried out either in direct current mode (DC magnetron sputter) or in alternating current mode (AC magnetron sputter). U.S. Pat. No. 4,166,018 discloses well-defined array of permanent magnets (here called 'outer magnetron' by way of distinction from a term 'inner magnetron' to be introduced later on) immediately behind the target distorts the trajectory of the electrons likewise present in the plasma and so achieves an appreciable enhancement of the gas plasma density in front of the target, thereby significantly increasing the sputter rate compared to ionic bombardment without the use of permanent magnets. A preferred type of magnetron sputter is unbalanced magnetron sputter. Here, the relative range of the magnetic field lines is prolonged far into the interior of the coating chamber by way of annular coils usually mounted outside of the coating chamber. The magnetic field can also be modified by control of the coil current.

To ensure as long a mean free path length of the mostly neutral target vapor particles (sputter particles), the entire magnetron sputter process is carried out in a closed coating chamber under conditions of high vacuum at an internal pressure of about $10^{-3}$ to $10^{-6}$ mbar. Some of the sputter particles deposit on the surface of the substrates, likewise arranged in the coating chamber, and envelope them in the course of coating with a thin layer. By applying a negative electric potential ("bias") to the substrate, or in the case of electrically non-conductive substrates, to a bias cathode in the neighborhood of the substrate (generally components of the substrate holder system), the layer morphology can be additionally influenced in a controlled manner. In typical industrial applications, the thin layer has a mean thickness in the range from about 0.1 to 5 microns. By a mixture of one or more reactive gases, usually nitrogen, oxygen or a gas containing carbon, into the coating chamber, chemical reactions or incorporations of the reactive gas atoms in the atomic structure of the thin layers, controlled modifications of the properties of the coating, such as hardness or adhesiveness, can be generated as well. With use of several different target materials, in the form either of one mixed target or in the form of at least two pure targets, multi-layer coatings can additionally affect the properties of the entire layer usefully. Multilayer coatings are usually produced by well-defined, alternating 'switching off and on' of individual targets. The improvement of quality and economy in multilayer coatings is the chief concern of the invention.

Such multilayer PVD coatings are desirable wherever the individual layers may assume different functions. For example, with a two-layer coating, it is possible to produce good strength of adhesion to the substrate material by means of a first layer, and to generate the surface functionality actually desired, for example tribological behavior or decorative effects, by means of an overlying second layer.

Devices for practicing multilayer magnetron sputter are known from a number of publications and patents. The devices and practices related to the invention differ primarily in the layouts of the instrumental target-cathode-magnetron subsystem. Thus, U.S. Pat. No. 4,166,018 describes what can be referred to as a planar magnetron. Here, the target, rectangular in shape and preferably serving as cathode at the same time, is mounted with cooling directly over a set of permanent magnets. The magnetic field substantially increases the density of ionization of the sputter gas in the neighborhood of the target, thereby positively influencing the rate of attrition. A disadvantage is the highly non-homogeneous removal of material, manifesting itself in the form of erosion pits on the target.

To improve the removal of material U.S. Pat. No. 4,356,073 proposes a hollow cylinder target geometry including permanent magnet means. By gradually rotating the target about its axis of rotation, the non-homogeneity of removal can be largely compensated. This patent also disclosed how azimuthally segmented differences in composition of the material of the hollow cylinder target and rotation of the target can be used to deposit different materials on a substrate in the form of multilayer coatings. Besides the complicated process of production and assembly of such azimuthally segmented hollow cylinder targets, a disadvantageous effect is that a simultaneous and undesirable sputtering of different segments is difficult to avoid, so that an unintentional mixed coating of the substrate results.

In place of an azimuthally segmented hollow cylinder target, U.S. Pat. No. 4,443,318 proposes a target system made up of numerous individual planar target strips. The cylindrical cross-section is thus approximated by a polygonal cross-section, and the individual target strips are more readily replaced after wear than in the case of the azimuthally segmented hollow cylinder targets. However, by this modification, the improved utilization of the target material, advantageous for the hollow cylinder target according to U.S. Pat. No. 4,356,073, is sacrificed.

A disadvantage of all known processes for multilayer PVD coating of substrates by means of a magnetron sputter system is that such a coating essentially entails the following problems. Either individual targets must be alternately excluded, usually by disconnecting and covering with a so-called "shutter," from the coating process, thereby reducing the overall productivity of a system, or the coating process must be interrupted, and the next layer vapor deposited only after a mechanical change of target. A change of target always involves, in addition to the mechanical manipulation of units, a time-consuming process of prior aeration and subsequent evacuation. Further, in the case of a mechanical change of target, there is always a great danger that undesirable contamination will reach the substrate surface already produced, with adverse consequences to the quality of the coating as a whole. To avoid target changes, there is a multichamber system can be employed. However, this involves uneconomical, operating and maintenance costs. Such multichamber sputter systems are not competitive for purposes of small and medium mass production.

EP 0,495,215 and GB 1,194,428 describe evaporating devices having so-called turnabout targets. Target plates to be subjected to vapor deposition are mounted at the ends of a cross holder, having for example four axes. By rotating the cross holder, a different target plate can be brought into working position with respect to the coating chamber in each instance. A disadvantage of both of these patents is that no magnetic means are provided for generating the magnetron effect.

OBJECTS AND SUMMARY

An object of the present invention, then, is to develop a device and a process for multilayer PVD coating in a magnetron sputter system preferably having only one separate coating chamber. At the same time, neither is the overall productivity of the system diminished by partial 'disconnection' of individual targets, nor is the coating process to be interrupted by any mechanical change of target. The invention is preferably to be applicable economically in small and medium mass production ("job coating") and in the laboratory field as well.

This object is accomplished, according to the invention, with a magnetron sputter system having a novel sputter target system usable as a cathode. This sputter target system includes a number of rectangular single targets connected together in the form of a regular polygon, thus forming a hollow polygon in cross-section. The sputter target system is preferably arranged centrally in front of the outer magnetron, and may be manipulated by rotation about its axis of symmetry in steps of ±360/N degrees, where N represents the order of symmetry. Laterally, the sputter target system is provided with a mechanical shielding, so that preferably only the individual target is exposed to the ionic bombardment in each instance. By loading the sputter target system with at least two different target materials, the sputter material exposed to the ionic bombardment can be readily changed without interrupting the process, by a rotary step of the sputter target system.

The interior of the hollow polygon is preferably equipped with permanent magnets (inner magnetron) in a well-defined manner. In this way, the magnetron effect in the process of ionization can be substantially improved.

In another embodiment, the individual targets of the sputter target system are mounted on plates carrying coolant and are preferably insulated electrically from each other. Target cooling is advantageous, especially with enhanced sputter output or with longer coating times, say in the range from 15 minutes to four hours. The plates, electrically insulated from each other, are preferably usable as cathodes at the same time, provided the target material is not itself electrically conductive. In this case, the magnetron sputter should be carried out in alternating current mode (AC magnetron sputter), as opposed to the direct current mode (DC magnetron sputter) for electrically conductive target materials.

Further, provision is made for arranging a plurality of sputter target systems according to the invention in front of an outer magnetron in such manner that they just remain fully rotatable individually, i.e., that the individual sputter targets can be brought into any desired angular azimuth position, yet that they just touch each other lineally at the edges in preferred angular position, thus presenting together a virtually closed sputter area to the ionic bombardment. In this way, only the two outer sputter target systems need be mechanically shielded from lateral ionic bombardment. By such an arrangement of a plurality of sputter target systems, for example in the case of sputter target systems having 'triangular symmetry' in cross-section (triangle array), the sputter surface is moreover advantageously enlarged relative to the distance from the permanent magnets of the outer magnetron. Considering only one single spatially isolated sputter target system, this is not possible. Here, an enlargement of the sputter area under otherwise constant conditions always leads disadvantageously to an enlargement of the distance of the sputter surface from the outer magnetron.

Fitting the coating chamber with a plurality of the subcomponents is another advantageous modification which enhances the productivity of the magnetron sputter system.

By well-defined rotation of the sputter target system in steps of 360/N degrees, where N stands for the order of symmetry of the sputter target system, a novel process of multilayer PVD coating can be achieved. Without any interruption of the process, in accordance with a temporally preassigned control cycle, in each instance a different target material can be exposed to the ionic bombardment, thereby accomplishing a multilayer coating. By admixture of reactive gas in the coating chamber, the entire coating process can be carried out reactively, thus enlarging the number of coatings and coating properties that can be produced.

The present sputter target system is not limited to magnetron sputter. It can also be employed in other sputter and/or evaporation processes, such as in arc evaporation or in the relatively new processes of laser-induced evaporation ("laser ablation") or combination processes thereof.

The present systems and methods provide an advantage in that in one coating process, several target materials are alternatively available, and a change of target is possible without interruption of the process, permitting appreciably improvement of both the overall productivity of a system and the quality of coating. At the same time, in the presence of two or more of the present sputter target systems, the number of possible variations in the production of multilayer mixed coatings and/or gradient coatings is considerably increased.

BRIEF DESCRIPTION OF THE DRAWINGS

The invention will be described below in more detail with reference to an embodiment by way of example. In schematic representation.

DETAILED DESCRIPTION OF PREFERRED EMBODIMENTS

Figure 1:
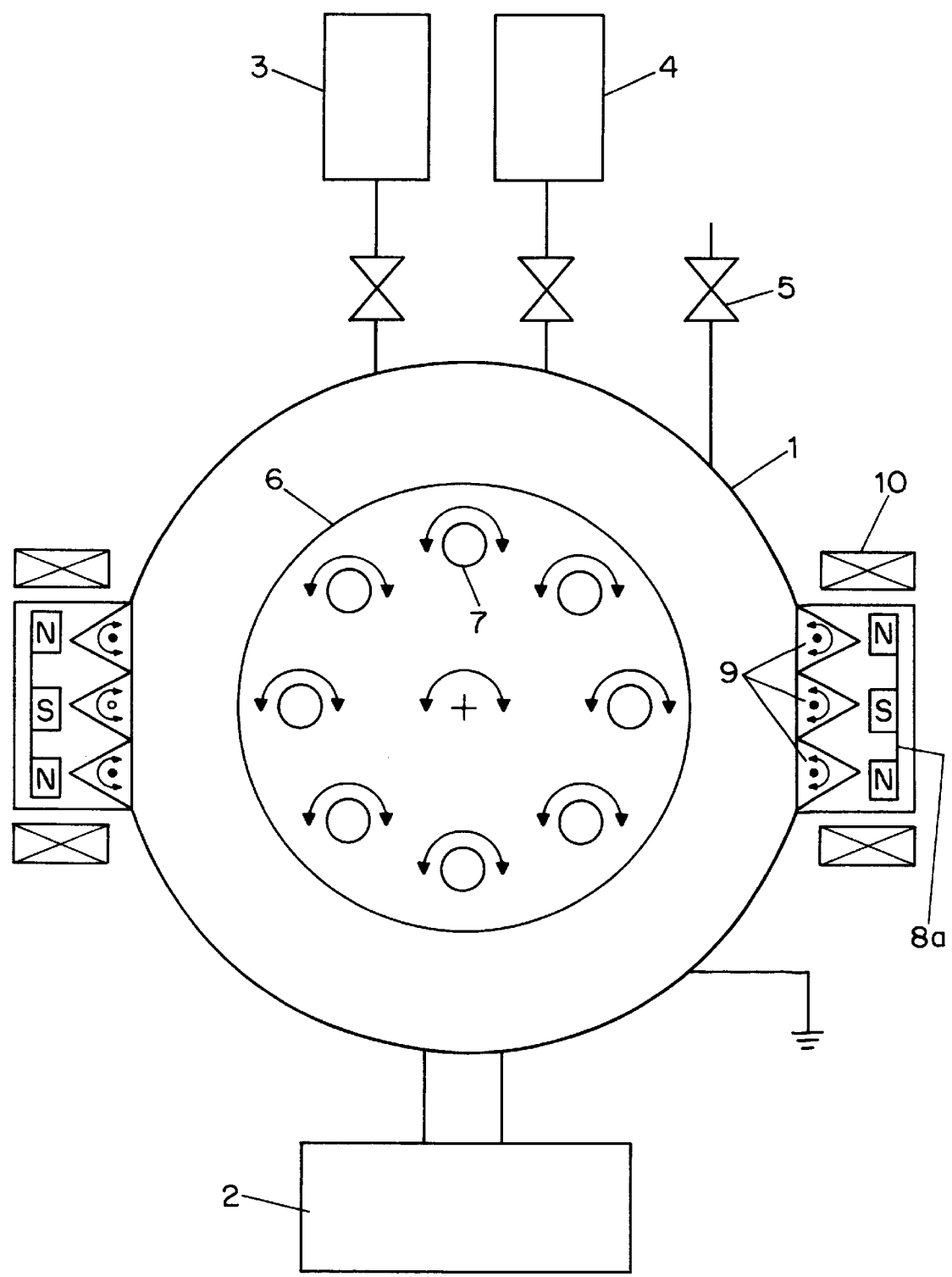
FIG. 1 shows a cross-section of an unbalanced magnetron sputter system having two sputter sources, consisting of three sputter target systems in a triangle array in each instance.

The cross-section of a device of the kind according to the invention for multilayer PVD coating by magnetron sputter, preferably an unbalanced magnetron sputter, is shown in FIG. 1. A coating chamber 1, preferably made of special steel having a wall thickness of about 2.5 cm, is evacuable to an internal pressure of as low as $10^{-6}$ mbar by means of an evacuating system 2. By way of the valve- and pressure-controlled working gas supply 3, the working gas required for the gas discharge processes, preferably argon, is supplied to the coating chamber 1. Each of two lateral bulges of the coating chamber 1 accommodates a sputter source consisting of an outer magnetron 8a and three sputter target systems 9.

The three sputter target systems 9 are constructed in a triangular array, and will be described in more detail later with reference to FIG. 2. To achieve an unbalanced magnetron effect, the magnetic field of the outer magnetron 8a is superimposed with an annular coil magnetic field, generated by annular coils 10 arranged outside of the coating chamber 1. The substrates 7 to be coated are arranged on a substrate holder platform 6. The substrate holder platform 6 rotates under motor power and is controllable by a process control (not shown in FIG. 1) with respect to its frequency of rotation about the vertical central axis of the coating chamber 1. The substrates 7, schematically represented in FIG. 1 as cylindrical shapes, are rotatable about horizontal axes, preferably using the process control, on the substrate holder platform 6 and are electrically insulated from the coating chamber 1, by rotating means not shown. With the aid of the twofold rotation of the substrates 7 as indicated in FIG. 1, process wise a uniform all-around coating of the substrates 7 is assured.

The loading of the coating chamber 1 with substrates 7 is accomplished by way of a hermetically sealed door opening, not represented in FIG. 1, in the coating chamber 1. The aeration of the coating chamber 1 is accomplished after a coating operation by way of the aeration valve 5. The reactive gas supply 4 serves for admixture of a reactive gas, preferably nitrogen, oxygen or a gas containing carbon, with the gas ion plasma during coating for reactive process control. A well-defined electrical high potential, generated by a current supply not shown in FIG. 1, is connected between the grounded coating chamber 1 and preferably the individual targets which are electrically insulated from the coating chamber 1 and each other. Preferably, the targets are individually connectable to the high potential. The gas discharge process in the coating chamber 1 is started at a working gas pressure of preferably $10^{-3}$ mbar, and maintained under regulation and control by means of the process control during the coating.

Figure 2:
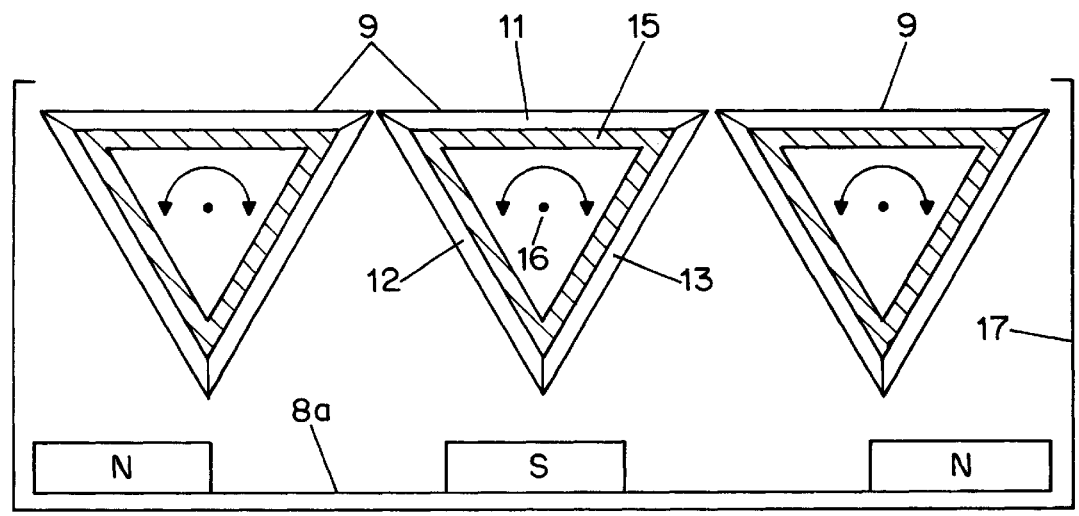
FIG. 2 shows a sputter source having three sputter target systems in a triangle array.

In FIG. 2, the two sputter sources indicated in FIG. 1 are shown in more detail. By way of the outer magnetron 8a, which illustratively includes three permanent magnets mounted in alternating polarity on a magnetically neutral plate inside the mechanical shielding 17, three sputter target systems 9 are arranged side-by-side. Such a sputter target system 9 consists of three individual targets 11, 12 and 13 mounted on plates 15 which carry a coolant. The three plates 15 with coolant individually have the shape of a rectangle and are so connected to each other that they take the shape of a hollow triangle in cross-section. The plates 15 carrying coolant are preferably cooled by means of cooling tubes 18 not shown in FIG. 2 (see FIG. 3) inside of the coolant-carrying plates 15, in which a coolant flows. At the contact interface between two coolant-carrying plates 15, there is a region of electrical insulation, not shown. Each of the three hollow triangles formed by the coolant-carrying plates 15 is rotatable mounted about the axis of symmetry 16 such that rotation can be effected by the process control and rotational driving means not shown.

With reference to FIGS. 1 and 2, a process according to the invention for multilayer PVD coating of substrates using a magnetron sputter system is now described in more detail. For example, a two-layer coating is to be produced, consisting of a chromium underlayer about 0.3 microns in thickness and a zirconium nitride cover layer about 1.5 microns in thickness. For this application, the target material used for the individual targets 11 is high-purity chromium, and for the individual targets 12 and 13, high-purity zirconium. In the start position, the three sputter target systems 9 of the two sputter sources in the device according to FIG. 1 are azimuthally positioned in such a manner that the individual targets 11 of the sputter target system 9 form a virtually closed, sputter surface for the ionic bombardment. After loading of the coating chamber 1 with substrates 7, which have been previously washed and ultrasonically cleaned, the process of coating begins. The coating process is generally performed in subsequent phases taking place in a temporal sequence of evacuation, heating, etching, loading, cooling, aerating.

The coating phase, for producing a two-layer coating, divides into two subphases. In the first subphase, the chromium underlayer is formed. To do this, the sputter target systems 9 are maintained in their start position as to their azimuthal orientation, and the sputter process is carried out with argon ions at a pressure of about $10^{-3}$ mbar in the coating chamber 1. As cathodes, the individual targets 11 are impressed with a direct current voltage, preferably of about 400 V relative to the grounded coating chamber 1. At a coating rate of about 15 nm per minute, reached with the aid of the process control, the first subphase of the coating phase ends after about 25 minutes. The second subphase begins with a rotary step of the sputter target systems 9, effecting a rotation of the sputter target systems 9 by 120 degrees (360/N, where N=3) about their axes of rotation 16. Thus, the target materials exposed to the ionic bombardment are virtually instantaneously switched from chromium to zirconium without affecting the other process parameters in any way and without interruption of the coating phase. At the same time, the reactive gas nitrogen is mixed into the coating chamber 1 through the reactive gas supply 4 up to a nitrogen partial pressure of preferably $10^{-3}$ mbar. With a deposition rate of about 15 nm per minute, the second subphase of the coating phase ends after about 100 minutes, and the two-layer coating has been deposited on the substrates 7. The coating process is then completed after a cooling phase of about 20 minutes and after aerating the coating chamber 1 by opening the aerating valve 5.

Figure 3:
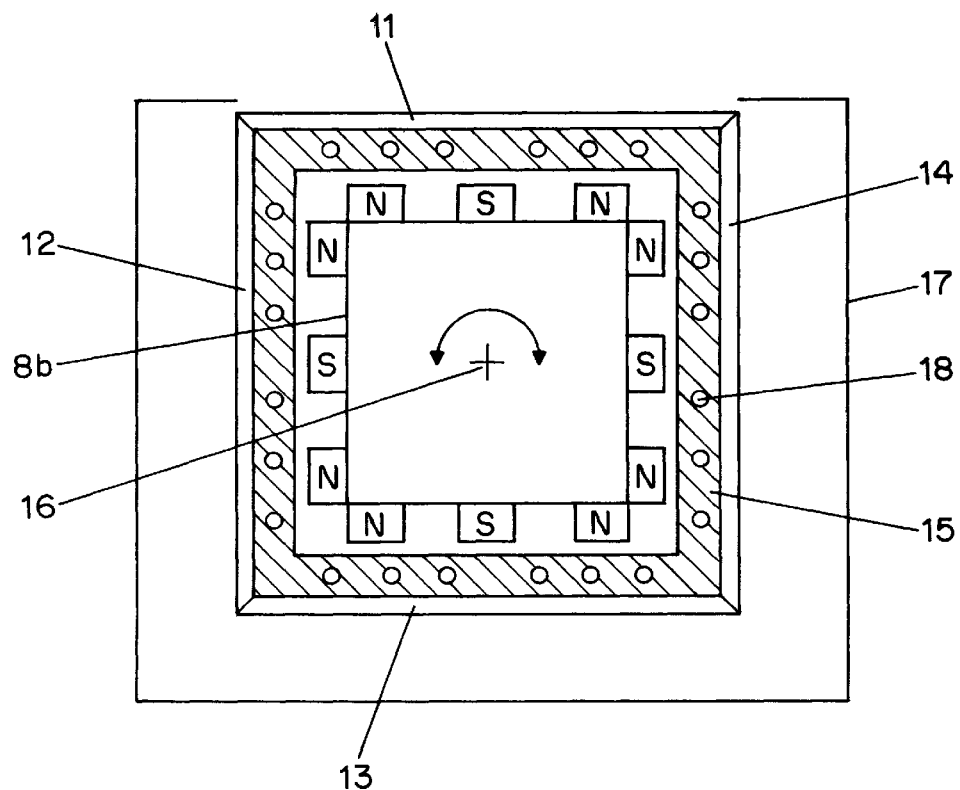
FIG. 3 shows a sputter target system having four individual targets in a square array.

In FIG. 3, the hollow interior of the sputter target system is illustrated with four inner magnetrons 8b mounted directly behind the coolant-carrying plates 15 on which the individual targets 11 to 14 are arranged. In this way, an improvement of the effect of the magnetic field on the process of gas ionization in the coating chamber 1 can be obtained.

Figure 4A:
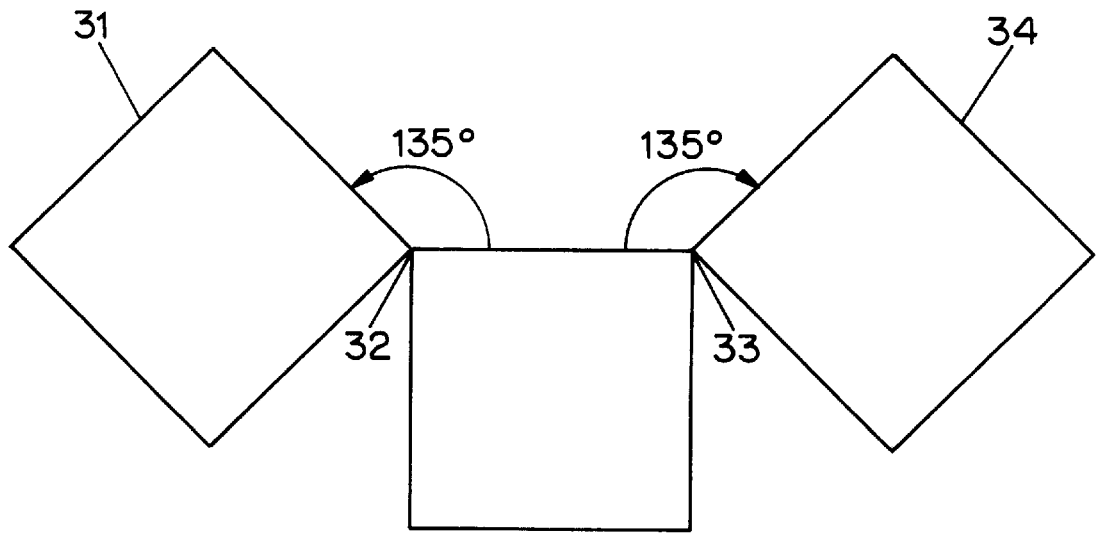
FIG. 4a shows an arrangement of three sputter target systems just individually rotatable without interference, each having four individual targets (square array).
Figure 4B:
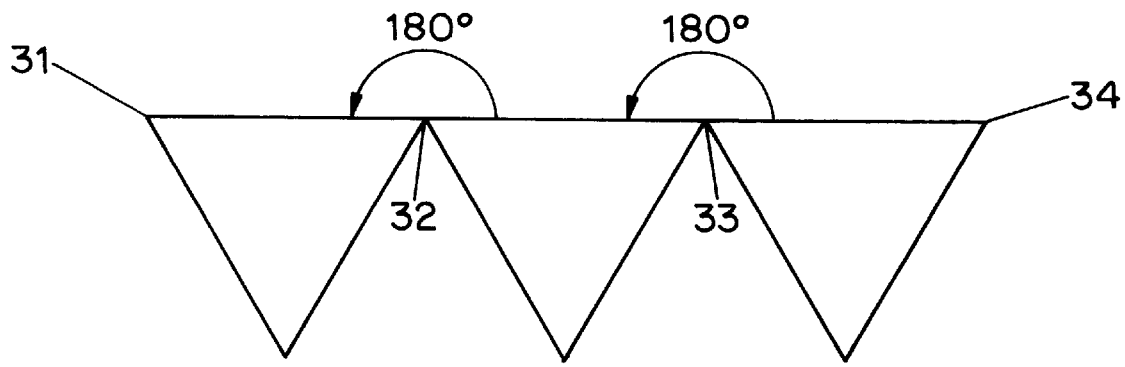
FIG. 4b shows an arrangement of three sputter target systems just individually rotatable without interference, each having three individual targets (triangular array).

With reference to FIG. 4, a further embodiment of the invention will be illustrated in more detail. To reduce the distance of the sputter area offered to the ionic bombardment from the outer magnetron 8a, it is desirable for a number of the present sputter target systems to be arrayed in front of an outer magnetron in close proximity to each other such that they are just capable of being fully rotated individually, without interfering with each other. This forms an overall sputter surface, indicated by a line in horizontal section in FIG. 4, consisting of the connection from the first target edge 31 by way of the first and second target lines of contact 32 and 33 to the second target edge 34. In the case of a triangular array, the several target sputter systems can yield an especially advantageous planar total sputter surface, namely the included angle of the partial sputter areas can be 180 degrees as illustrated in FIG. 4b. In the case of a square array, the several partial sputter areas include at most an angle of 135 degrees, as in FIG. 4a.

What is claimed:

1. A device for multilayer PVD coating of a substrate comprising:
    a coating chamber for receiving at least one substrate to be coated;
    a sputter source within said coating chamber, said sputter source including a sputter target system, said sputter target system including at least two target holders, each said target holders for receiving a plurality of targets and arranging the plurality of targets as a polygonal structure having an axis of symmetry, said at least two target holders being arranged with respect to each other to just admit full rotation about their axes of symmetry;
    a rotational drive mechanism operatively coupled to said at least two target holders; and
    a controller, said controller being operatively coupled to the rotational drive mechanism and controlling the rotation of said at least two target holders.

2. The device according to claim 1, wherein said sputter target system further includes a plurality of cooling plates, said plurality of cooling plates corresponding to said plurality of targets.

3. The device according to claim 1, wherein the sputter target system includes three holders, each holder for receiving three targets in a triangular array, said holders being arranged such that adjacent targets from each respective holder establish a planar surface with an angle substantially equal to 180 degrees.

4. The device according to claim 3, wherein each said holders are rotatable about their respective axes of symmetry in steps of 120 degrees.

5. The device according to claim 1, wherein the sputter target system includes three holders, each holder for receiving four targets in a square array, said holders being arranged such that adjacent targets from each respective holder establish a planar surface with an angle substantially equal to 135 degrees.

6. The device according to claim 5, wherein each said holders are rotatable about their respective axes of symmetry in steps of 90 degrees.

7. The device according to claim 1, wherein the controller effects rotation of each target holder in steps equal to 360/N degrees, where N is the number of targets.

8. The device according to claim 7, wherein each holder accommodates three targets and wherein the rotational step is 120 degrees.

9. The device according to claim 7, wherein each holder accommodates four targets and wherein the rotational step is 90 degrees.

10. The device according to claim 1, wherein the chamber includes an inlet for receiving at least one reactive gas.

11. A process for multilayer PVD coating of substrates using a sputtering source directed against one of multiple targets in each of at least two rotatable target holders, the process comprising:
    arranging the multiple targets in each of the target holders as a polygonal structure having an axis of symmetry;
    arranging the at least two target holders with respect to each other to just admit full rotation about the axes of symmetry;
    sputtering material from a first target in at least one of said at least two target holders for a first duration;
    rotating at least one of the target holders about the axis of symmetry to expose at least a second target of each rotated holder to a sputtering source; and
    sputtering material from at least the second target for a second duration.

12. The process for multilayer PVD coating as defined by claim 11, wherein each target holder has N symmetrical sides arranged about an axis of symmetry and said rotating step comprises rotating at least one of the target holders by an angle substantially equal to 360/N degrees.

13. The process for multilayer PVD coating as defined by claim 11, wherein the multiple targets in each holder include a first material and at least a second material for coating on the substrate.

14. A device for multilayer PVD coating of a substrate comprising:
    a coating chamber for receiving at least one substrate to be coated;
    a sputter source within said coating chamber;
    a sputter target system as part of said sputter source, said sputter target system including at least two target holders, each holder for receiving a plurality of targets and for arranging the plurality of targets as a polygonal structure having an axis of symmetry and being rotatable about said axis of symmetry, said at least two target holders being arranged with respect to each other to just admit full rotation about their axes of symmetry.

15. The device according to claim 14, wherein the sputter target system includes three target holders, each target holder for receiving three targets in a triangular array, said holders being arranged such that adjacent targets from each respective holder establish a planar surface with an angle substantially equal to 180 degrees.

16. The device according to claim 15, wherein each said holders are rotatable about their respective axes of symmetry in steps of 120 degrees.

17. The device according to claim 14, wherein the sputter target system includes three holders, each holder for receiving four targets in a square array, said holders being arranged such that adjacent targets from each respective holder established a planar surface with an angle substantially equal to 135 degrees.

18. The device according to claim 17, wherein each said holders are rotatable about their respective axes of symmetry in steps of 90 degrees.

* * * * *

UNITED STATES PATENT AND TRADEMARK OFFICE
CERTIFICATE OF CORRECTION

PATENT NO.   : 6,113,752
DATED        : September 5, 2000
INVENTOR(S)  : Hollstein It is certified that error appears in the above-identified patent and that said Letters Patent is hereby corrected as shown below:

<u>Title page,</u>
Item [56], References Cited, FOREIGN PATENT DOCUMENTS, insert -- 1366608 9/1974  United Kingdom --

Signed and Sealed this

Twelfth Day of November, 2002

Attest:

JAMES E. ROGAN
Attesting Officer        Director of the United States Patent and Trademark Office